US010863641B2

(12) United States Patent
Jeon et al.

(10) Patent No.: US 10,863,641 B2
(45) Date of Patent: Dec. 8, 2020

(54) FOLDABLE DISPLAY APPARATUS

(71) Applicant: LG DISPLAY CO., LTD., Seoul (KR)

(72) Inventors: Seungo Jeon, Seoul (KR); YoungJoon Yun, Paju-si (KR); ShinSuk Lee, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/198,075

(22) Filed: Nov. 21, 2018

(65) Prior Publication Data
US 2019/0174645 A1    Jun. 6, 2019

(30) Foreign Application Priority Data

Dec. 4, 2017    (KR) .................. 10-2017-0165009
Oct. 2, 2018    (KR) .................. 10-2018-0117837

(51) Int. Cl.
*G06F 1/16*    (2006.01)
*H05K 5/02*    (2006.01)
*H05K 5/00*    (2006.01)
*G09F 9/30*    (2006.01)

(52) U.S. Cl.
CPC ......... *H05K 5/0226* (2013.01); *G06F 1/1641* (2013.01); *G09F 9/301* (2013.01); *H05K 5/0017* (2013.01)

(58) Field of Classification Search
None
See application file for complete search history.

(56) References Cited

U.S. PATENT DOCUMENTS

| | | | | |
|---|---|---|---|---|
| 9,348,450 B1* | 5/2016 | Kim | .................. | G06F 3/0412 |
| 9,801,290 B2* | 10/2017 | Ahn | .................. | G06F 1/1652 |
| 9,848,502 B1* | 12/2017 | Chu | .................. | E05D 7/00 |
| 10,117,346 B2* | 10/2018 | Yang | .................. | G09F 9/00 |
| 2011/0063783 A1* | 3/2011 | Shim | .................. | G06F 1/1681 |
| | | | | 361/679.01 |
| 2011/0065479 A1* | 3/2011 | Nader | .................. | G06F 1/1626 |
| | | | | 455/566 |
| 2012/0120618 A1* | 5/2012 | Bohn | .................. | G06F 1/1681 |
| | | | | 361/749 |
| 2014/0126133 A1* | 5/2014 | Griffin | .................. | G06F 1/1652 |
| | | | | 361/679.27 |
| 2015/0089974 A1* | 4/2015 | Seo | .................. | A44C 5/0076 |
| | | | | 63/1.13 |

FOREIGN PATENT DOCUMENTS

KR    10-2016-0097034 A    8/2016

* cited by examiner

*Primary Examiner* — Courtney L Smith
*Assistant Examiner* — Rashen E Morrison
(74) *Attorney, Agent, or Firm* — Birch, Stewart, Kolasch & Birch, LLP (57) ABSTRACT

A foldable display apparatus includes a mid-layer having a hinge region; a panel on the mid-layer; a pair of set frames under the mid-layer; and a hinge portion connected to the pair of set frames, and moving as the panel is folded or unfolded. Since a sliding section of the panel in the hinge region is compensated for during the folding and unfolding of the panel, the size of a bezel that would otherwise accommodate a sliding section can be reduced.

17 Claims, 7 Drawing Sheets

FOLDABLE DISPLAY APPARATUS

CROSS-REFERENCE TO RELATED APPLICATION

This application claims the priority benefit of Korean Patent Application No. 10-2017-0165009 filed on Dec. 4, 2017 and No. 10-2018-0117837 filed on Oct. 2, 2018, in the Korean Intellectual Property Office, the entire disclosure of which are hereby incorporated by reference.

BACKGROUND OF THE INVENTION

1. Field of the Invention

The present invention generally relates to foldable displays and, more particularly, to foldable displays featuring a mechanism that compensates for any slack in the display panel that can result from the folding and unfolding of the foldable display apparatus, and provides support to the display panel when the foldable device is in an unfolded state.

2. Description of the Related Art

Foldable displays are being researched as the next stage in display technology for a variety of applications, including commercial, home entertainment, and mobile.

A foldable display can be implemented by connecting separate flat display panels or by using a flexible display panel. A flexible display panel can refer to a display that is curved, bendable, foldable, or even rollable (like paper).

With the advent of organic light emitting diode (OLED) technology, which does not require a backlight, the utilization of thin and flexible substrates, such as plastic, are becoming more frequently used to create flexible display panels that are deformable by external pressure.

A plastic substrate can have a structure in which both surfaces of the base film are barrier-coated. A base film can be implemented in the form of various resins, such as polyimides (PI), polycarbonates (PC), polyethyleneterephtalates (PET), polyethersulphones (PES), polythylenenaphthalates (PEN), fiber reinforced plastics (FRP), etc. The barrier coating is typically implemented on the opposite surfaces of the base film, and an organic film or an inorganic film can also be implemented to maintain flexibility.

However, the primary concern in implementing a flexible display for widespread use is durability, and the need for protection and support for the display panel and its related components. Accordingly, there are many challenges remaining in the quest to implement a flexible display—particularly one that rolls.

A foldable display, however, can be relatively simple to implement through the use of a mechanical structure to fold and unfold the device. Such foldable displays can primarily be distinguished between external folding displays and internal folding displays, wherein the display panel is disposed on either the outside or inside of a folding mechanical structure, respectively.

The basic mechanics of a foldable display are akin to that of a book, in that the display, much like a book, folds and unfolds. A set of frames typically house and support the foldable display panel and generally functions as the cover of the book. In an external folding display, the flexible display panel can be situated similar to that of a book jacket, whereas in an internal folding display, the flexible display panel can be situated similar to that of a book's inner cover.

However, a common problem for external folding displays is similar to what happens to a book jacket when the book opens: slack in the middle region. While slack in a book jacket does not pose a significant problem in books, where the book jacket is primarily observed when the book is in a folded or closed state, the display panel on an external display device is primarily viewed when the display is in an unfolded or open state. As a result, when there is slack on the display panel on an unfolded or opened external folding display, the slack creates an uneven and unstable viewing surface that is not supported. These problems are further compounded when such folding displays are implemented in applications requiring touch, such as in mobile devices. Pressure from touch on an unsupported folding display panel can result in damage, including stretching or tearing, and can also result in imprints along the edges. Also, the user experience with a touch display is much more pleasant where there is a consistent feel and even surface to the display panel.

A concept used to address this problem is a sliding mechanism in the frame of the foldable display. Very simply, an end of the foldable display panel slides along the frame, pulling taught any slack in the foldable display panel as the foldable display transitions to an unfolded state, and slides back to allow the foldable display panel to fold along with the frames as the foldable display transitions to a folded state. However, this requires the frames to extend well beyond the unfolded length of the foldable display panel to accommodate the sliding area, and results in a bigger and bulkier device. This directly goes against the trend in mobile devices for smaller devices and narrower bezels on displays. Additionally, the sliding mechanisms are prone to mechanical malfunctions and damage, particularly if the sliding pathway is exposed.

Another common problem faced by foldable displays is wear and tear to the portions of the display panel that are repeatedly folded open and closed. The plastic substrates in the flexible display panels are subject to stress every time they are folded or bent. The impact of the stress on the substrates has been mitigated by incorporating an additional layer of material to provide additional support to the flexible display panel. While this only marginally mitigates the amount of stress on the substrates, such additional layer allows the flexible display panel to better maintain its form and integrity.

The level of stress on the substrates has a direct correlation to the degree at which it must fold or bend, and has an inverse relationship to the radius of curvature of each fold or bend. As such, this stress can be generally mitigated by increasing the radius of curvature in the fold, or requiring less of a sharp fold on the flexible display panel. This can be done by manipulating the shape of the foldable displays in the folded or closed position, such that the foldable displays incorporate more folds, with each fold requiring less of a sharp fold and turn.

A related art document includes Korean Patent Publication No. 10-2016-0097034 (published on Aug. 17, 2016).

SUMMARY OF THE INVENTION

In accordance with the present disclosure, a foldable display includes a flexible display panel, a mid-layer disposed on the underside of the flexible display panel, set frames supporting the mid-layer, curved ends on the set frames in the region corresponding to where the flexible display panel and mid-layer folds or bends, joints hinged off of each curved end with the other end of the joint hinged to a support block. As the set frames rotate around the where they are hinged to the joints when the foldable display transitions between a folded and unfolded state, the joints also rotate around the ends of the support block to which they are hinged, such that they increase or decrease the space between the set frames in accordance with any slack to the flexible display panel. In the joints rotating around the set frames and support block, the support block also moves back and forth relative to the set frames, such that it is level with the set frames when the foldable display is in an unfolded or open state, and is retreated from the flexible display panel and the curved ends of the set frames when the foldable display is in a folded or closed state.

The foldable display can most commonly be folded into two primary viewing sections, in what is typically referred to as a 'book' or 'clamshell' concept. However, the foldable display can be folded or bent into providing more than the traditional two primary viewing sections, such as a 'trifold wallet' concept and so on. As a result, the present disclosure should not be interpreted as being limited to two set frames with one hinge region, but as simply illustrating the components and mechanics relating to the hinge region of a foldable display, whether the overall foldable display includes only one folding area or three.

Additionally, while the foldable display has been described as being enabled by OLED technology, the flexible display panels described in the present disclosure are not limited to plastic OLED panels. Alternatively, the present disclosure can also be applicable to flexible electronic paper (e-paper) displays, flexible micro LED displays, and other flexible display technologies, regardless of whether they utilize organic light emitting diodes or plastic substrates.

An object of the present disclosure is to provide a foldable display configured to reduce the size of the set frames, and therefore reduce the size of the overall foldable display device and any bezels therein, by compensating for any slack to the flexible display panel through a hinge configuration in each folding area. This hinge configuration to compensate for slack to the flexible display panel would eliminate the need for a sliding mechanism, which the set frames would have had to otherwise accommodate.

According to another object of the present disclosure, when the foldable display is in an open or unfolded state, support will be provided to sections of the flexible display panel that are disposed in the gap between set frames. The hinge configuration includes a support block that moves back and forth as it compensates for any slack in the flexible display panel caused by the set frames' rotating as the foldable display transitions between a folded and unfolded state. This support block moves towards the display panel as the foldable display unfolds, and provides support to the overlapping portion of the flexible display panel.

Another object of the present disclosure is to provide additional support throughout the flexible display panel, including the portions in which the flexible display panel is folded, with a mid-layer that includes a slit pattern in the area corresponding to where the flexible display panel folds, and a curved end corresponding to this same folding area on the set frames. The slit patterns on the mid-layer allows for additional reinforcement to the flexible display panel while also allowing for greater flexibility and less stress on the flexible display panel as a result. The curved ends of the set frames provides rigid and additional support to the mid-layer, as well as the flexible display panel, while also increasing the radius of curvature of the flexible display panel when the foldable display is in a folded or closed state, thereby reducing stress to the flexible display panel.

Objects of the present disclosure are not limited to the above-described objects, and other objects and advantages can be appreciated by those skilled in the art from the following descriptions. Further, those skilled in the art will be able to appreciate that the objects and advantages of the present disclosure can be practiced by the means recited herein.

DETAILED DESCRIPTION OF THE EMBODIMENTS

The above objects, features and advantages will become apparent from the detailed description with reference to the accompanying drawings, such that those skilled in the art will be able to easily practice the technical ideas of the present disclosure.

Detailed descriptions of well-known functions or configurations can be omitted in order not to unnecessarily obscure the embodiment of the present disclosure. Throughout the drawings, like reference numerals refer to like elements.

When terms such as, "on," "above," "below," and "next," are used to describe the position or relation between components, one or more other components can be positioned between said components unless the terms are used with the term "immediately," or "directly." For example, when an element or layer is disposed "on" another element or layer, another layer or another element can be interposed directly on the other element or therebetween.

Although the terms, "first," "second," and the like are used to describe various components, the positioning or order of these components are not confined by these terms. These terms are merely used to distinguish the components. Therefore, the first component to be mentioned below can be referred to as a second component in the technical concept of the present disclosure.

Hereinafter, a foldable display according to the present disclosure will be described in detail with reference to the accompanying drawings.

Figure 1:
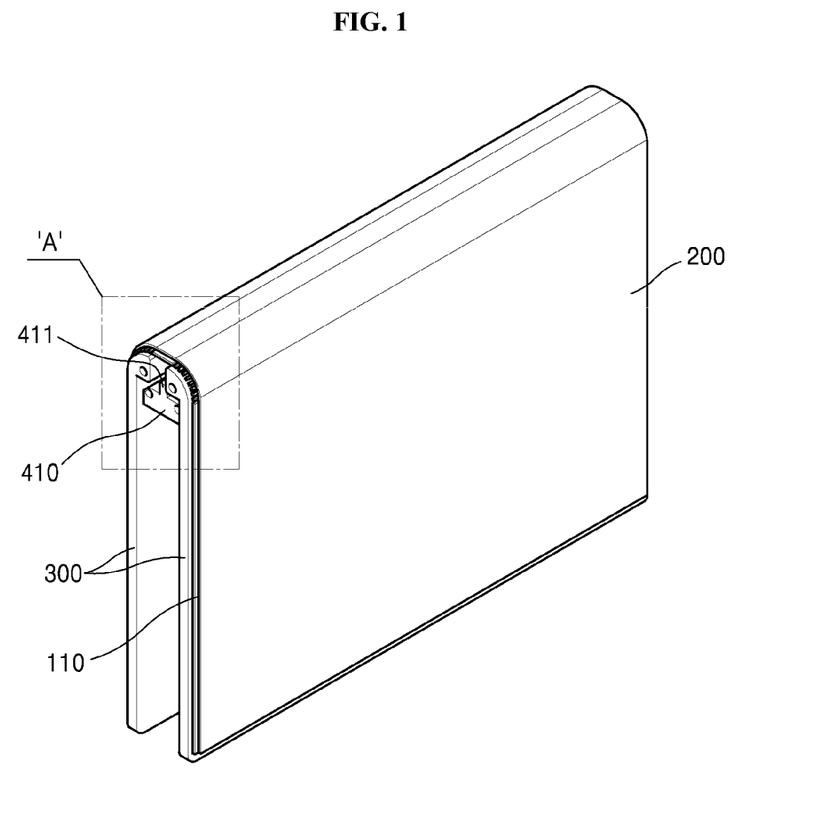
FIG. 1 is a perspective view of a foldable display in a folded state, according to an embodiment of the present disclosure.
Figure 2:
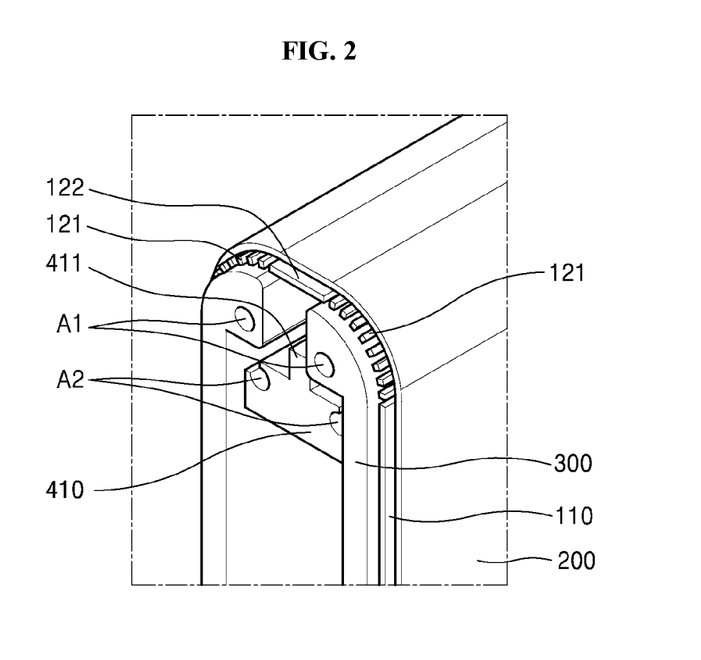
FIG. 2 is an enlarged perspective view of an area A' of the foldable display in a folded state, according to an embodiment of the present disclosure.
Figure 3:
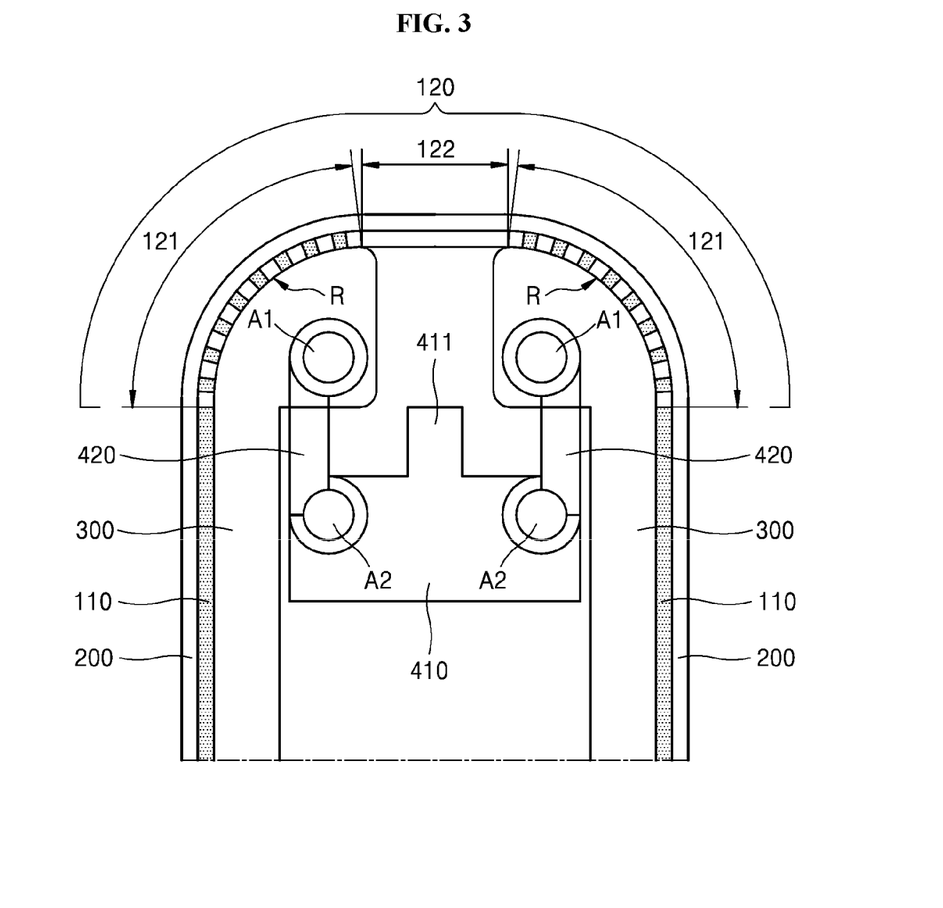
FIG. 3 is a cross-sectional view of the foldable display in a folded state, according to an embodiment of the present disclosure.

FIG. 1 is a perspective view of a foldable display, according to an embodiment of the present disclosure, in a folded or closed state. FIG. 2 is an enlarged perspective view of an area of the same foldable display in FIG. 1. FIG. 3 is a cross-sectional view of the same foldable display in FIG. 1.

In FIGS. 1 to 3 and 6, the foldable display according to the present disclosure can include a mid-layer 100, set frames 300, and a hinge region 120.

The mid-layer 100 has a plate structure, and in the hinge region 120, includes a folding area 121 and a support area 122.

A flexible display panel 200 is arranged above the mid-layer 100.

The pair of set frames 300 are arranged under the mid-layer 100, and are spaced apart from each other.

The hinge portion 400 connects the pair of set frames 300 and supports and removes support to the lower surface of the hinge region 120 of the mid-layer 100, as the hinge portion moves up and down as the panel 200 is folded or unfolded, and the spacing between the pair of set frames 300 change.

The structure of the hinge portion 400 is described below.

The hinge portion 400 can include a support member 410 and link members 420.

The support member 410 is arranged between the pair of set frames 300, and a support end 411 protrudes upward from the support member 410.

The link members 420 are hinged to both ends of the support member 410 and an end (or head) of each of the pair of set frames 300.

A first connection hole is provided on the head of each set frames 300.

One end of each of the link members 420 is hinged to the first connection hole by a first hinge A1.

The other end of each of the link members 420 is hinged to a second connection hole on each side of the support member 410 by a second hinge A2.

The support member 420 moves up and down as the panel 200 is folded or unfolded, thereby supporting and removing support to the lower surface of the hinge region 120 of the mid-layer.

Furthermore, the upper corner edges of the support member 410 are at an incline, and the upper outer edge of each set frame 300 on the side of the support member 410 can have a curvature R. These upper outer edges of the set frames 300 on the side of the support member 410 can also support the folding area 121 of the mid-layer, when the panel is in an unfolded state. The folding area 121 has slits that are spaced apart from each other at a given interval, which can be constant or varying.

Figure 4:
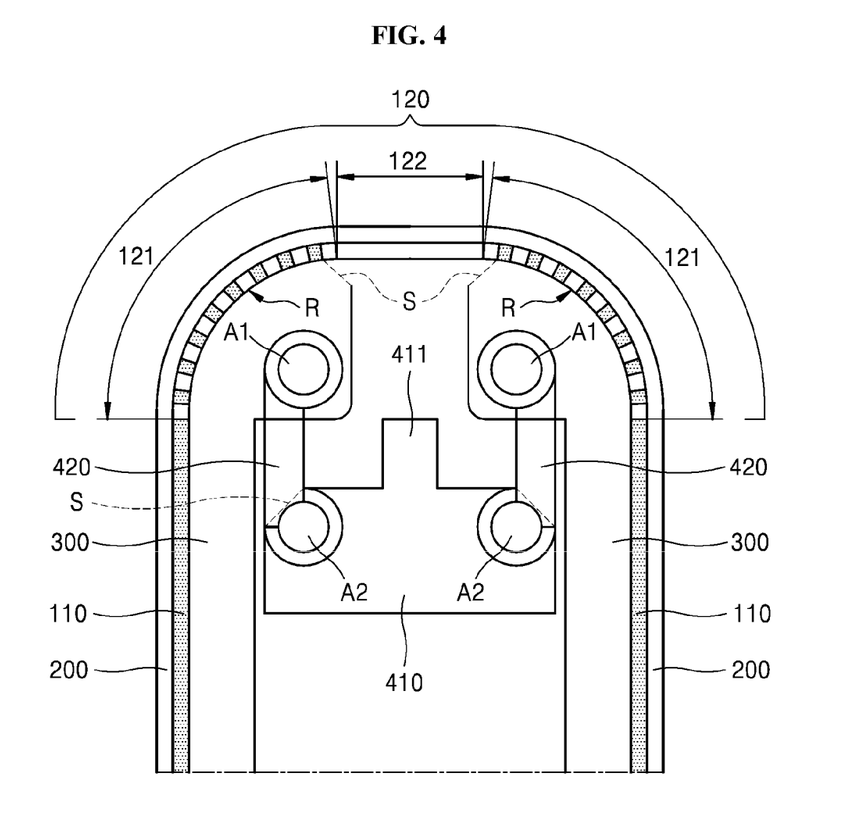
FIG. 4 is another cross-sectional view of the foldable display in a folded state, according to an embodiment of the present disclosure.

The upper corner edges of the support member 410 and the lower edge of the end of each set frame 300 on the side of the support member 410 have areas where they can contact each other as the panel shifts between a folded and unfolded state. As shown in FIGS. 3 and 4, the support member 410 is not interposed directly between the heads of the pair of set frames 300, and is instead retreated, whereby the heads of the pair of set frames 300 are across from each other just below the support area 122. In the folded state, the folding area 121 is curved, while the support area 122 is flat.

Next, the operation of the foldable display apparatus according to the present disclosure configured as above is described below.

FIG. 4 is another cross-sectional view of the foldable display apparatus in a folded state, according to the present disclosure.

As illustrated in FIG. 4, in the folded state, the pair of set frames 300 are parallel and face each other, as the support member 410 located between the pair of set frames 300 is positioned below the heads of the set frames 300.

The link members 420 are hinged to the support member 410 and the end of each set frame 300 in the hinge region 120. The link members 420 are parallel to each other, and are parallel to the pair of set frames 300.

Furthermore, in the folded state, the upper outer edge of each set frame 300 has a curved surface having a curvature, and contacts and supports the lower surface of the hinge region 120 corresponding to the folding area of the mid-layer 100. As shown in FIG. 4, the pair of link members 420 and the support member 410 form a U shape. Meanwhile the support member 410 has an upside-down T shape, as a result of its body and the support end 411.

Each of the upper corner edges of the support member 410 has an inclined surface S, and each of the lower inner corners of the end of each set frame 300 has an inclined surface as well. The upper corner edges of the support member 410 and the lower inner corners of the end of each set frame 300 allow the surfaces to only obliquely contact each other as the support member 410 moves up as the foldable display apparatus transitions to an unfolded state, thereby preventing damage or distortion to the set frames 300 that would otherwise be caused by direct contact during the move.

Figure 5:
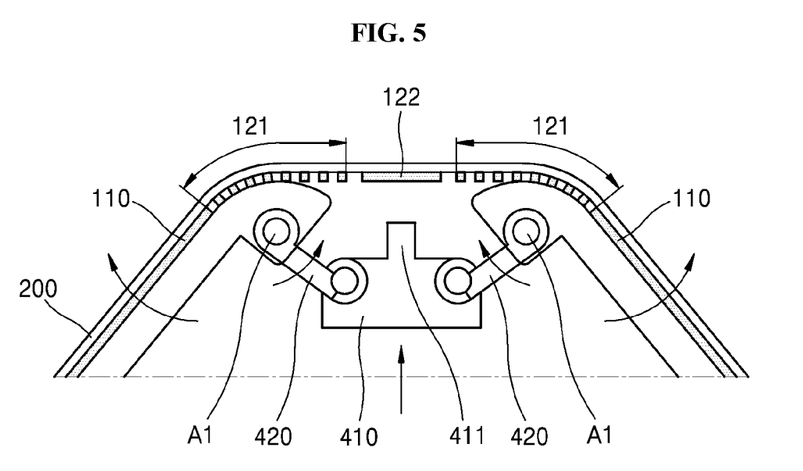
FIG. 5 illustrates the foldable display transitioning from a folded to unfolded state according to an embodiment of the present disclosure.

FIG. 5 illustrates the foldable display apparatus transitioning between a folded and unfolded state, according to an embodiment of the present disclosure.

Referring to FIG. 5, when the pair of set frames 300 simultaneously rotate upward, the link members 420 that are hinged to the end of each set frame 300 also rotate upward, relative to the first hinge A1, of each set frame 300.

Simultaneously, the set frames 300 can be gradually spread apart from each other while rotating.

In other words, as the link members 420 symmetrically rotate with respect to the pair of set frames 300, the support member 410, which is hinged to the other ends of the link members 420, moves upward, and the support end 411 on the upper surface of the support member 410 can move closer to the lower surface of the hinge region 120 of the mid-layer 100.

Figure 6:
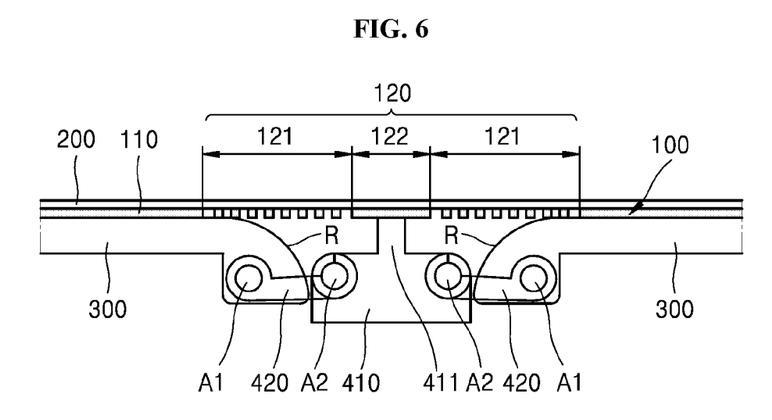
FIG. 6 illustrates the foldable display in an unfolded state according to an embodiment of the present disclosure.

FIG. 6 illustrates the foldable display apparatus in an unfolded state, according to an embodiment of the present disclosure.

Referring to FIG. 6, when the operation shown in FIG. 5 continues to completion, the pair of set frames 300 are moved to be aligned with each other.

Simultaneously, the link members 420 that are each hinged to an end of each set frame 300 rotate such that the support member 410 moves upward to contact the lower surface of the hinge region 120 of the mid-layer 100. Accordingly, the support member 410 becomes interposed between the pair of set frames 300, and becomes aligned with the pair of set frames 300.

Accordingly, the pair of set frames 300 that are aligned with each other are spaced apart further than in the state of FIG. 5. The support member 410 moves upward in proportion to the increase in the space between the pair of set frames 300. The support end 411 formed on an upper end of the support member 410 supports the hinge region 120 of the mid-layer 100 at the support area 122. The support end 411 is a protrusion extending from the main body of the support member 410.

The width of the support end 411 can vary depending on the width of the hinge region 120. The support end 411 can also be detachably formed on the support member 410 to be used with a variety of widths in the hinge region 120. When the support end 411 on the upper end of the support member 410 supports the hinge region 120, stress applied to the link members 420 connected to the support member 410 can be reduced or reduced.

In this state, the link members 420 can also be aligned with each other.

This replaces the need for a sliding section for the panel 200, as the support member's 410 movement compensates for the changing distance between the pair of set frames 300. And because a sliding section for the panel 200, as used in the related art, is no longer needed, the width of the bezel can be reduced accordingly.

Furthermore, during the unfolding of the panel 200, while the hinge region 120 of the mid-layer 100 can be partially supported by the curved surface having a curvature R on the end of each of the set frames 300, the support area 122 at the center of the hinge region 120 comes to be supported by the support end 411 that moves up in the unfolded state. And thus deformation of the panel 200 by an external force can be prevented. The curved portion (having a curvature R) on each end of the pair of set frames 300 does not contact the mid-layer 100 in the unfolded state. Further, the opposite ends of the panel 200 are fixed on the same positions on the respective pair of set frames 300, regardless of whether the panel 200 is folded or unfolded. As such, the hinge portion 400 moves to vary the space between the pair of set frames 300 such that the distance along the panel 200 between the predetermined portions on the opposite ends of the set frames 300 is maintained, and accordingly, there is no sliding of the panel nor the mid-layer 100.

Referring to FIG. 6, the mid-layer 100 according to the present disclosure can include a pair of frame areas 110 arranged on the pair of set frames 300 and a hinge region 120 connecting the pair of frame areas 110.

In particular, the hinge region 120 includes a support area 122 supported by the support end 411 when the panel is in an unfolded state, and a pair of folding areas 121 provided on both sides of the support area 122. In the unfolded state, the folding area 121 and the support area 122 are flat.

The direction of each slit in the pair of folding areas 121 can match a rotation axis line on which the mid-layer 100 rotates.

Accordingly, in the unfolded state of the panel 200, the pair of folding areas 121 can support the portions of the lower surface of the panel 200 that overlap the folding areas 121. The pair of folding areas 121 also support the portions of the lower surface of the panel 200 that overlap the folding areas 121, but on a curved surface that conforms to the shape of the curved ends of the pair of set frames 300. This helps to prevent and reduce deformations caused by a lack of support to the portions of the panel 200 corresponding to the hinge region 120.

Figure 7:
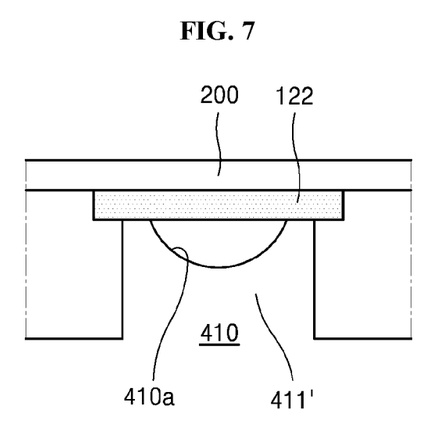
FIG. 7 illustrates another embodiment of a support end.

FIG. 7 illustrates another example of a support end according to an embodiment of the present disclosure.

Referring to FIG. 7, the width of a support end 411' according to an embodiment of the present disclosure can be substantially the same as or less than the width of the support area 122.

A recess 410a having a downward concave shape can be formed in the upper surface of the support end 411' according to an embodiment of the present disclosure.

The recess 410a can be in a hemispherical shape, but other shapes are also within the scope of the embodiments of the present disclosure, including a polygonal shape or an irregular shape.

Accordingly, the lower surface of the support area 122 can be substantially supported by the upper surface of the support end 411' at the edges of the recess 410a.

In other words, when the support end 411' is recessed, upward curvature deformations of the panel 200, due to a bulge in the upper surface of the support area 122 of the mid-layer 100 can be prevented.

Furthermore, the support end 411' according to the present disclosure can support the lower surface of the support area 122 via curved coupling or uneven coupling. Accordingly, when the support area 122 is supported, shifts in the location of the support area can be prevented or reduced. Also, the support area 122 can also include recesses that receive the edges of the recess 410a on the support end 411' to ensure better support between the support end 411' and the support area 122. The contact between the support end 411' and the support area 122 also prevents the overextension or folding of the panel 200 beyond a level position.

According to the above structure, during the unfolding of the panel, the pair of set frames are spaced apart from each other and the support member moves upward between the pair of set frames. Thus, the support area in the hinge region can be more stably supported by the support end formed on the upper end of the support member.

According to the present disclosure, when the panel is unfolded, the support end supports the support area in the hinge region and thus, deformations in the area where bending occurs can be reduced.

Additionally, if a recess is disposed in the upper surface of the support end, the impact generated when it contacts the lower surface of the mid-layer can be reduced. Accordingly, transfer of any such impact onto the panel can also be prevented or reduced.

As described above, according to an embodiment of the present disclosure, since the hinge region of the panel compensates for the sliding section in the related art during folding and unfolding, the size of the bezel can be reduced.

Furthermore, according to an embodiment of the present disclosure, since certain portions of the hinge region in the mid-layer incorporate a slit pattern, the hinge region of the panel can be more flexible and provide more stable support during folding and unfolding.

The embodiments of the present disclosure described above can be variously substituted, altered, and modified by those skilled in the art to which the present inventive concept pertains, without departing from the scope and sprit of the present disclosure. Therefore, the embodiments of present disclosure are not limited to the above-mentioned example embodiments and the accompanying drawings.

What is claimed is:

1. A foldable display apparatus, comprising:
   at least two set frames each having a curved portion corresponding to where the foldable display apparatus folds;
   between each set frame, a support member having at least one pair of links, each of the at least one pair of links having one portion hinged along a second axis disposed on opposite sides of the support member and another portion hinged along a first axis disposed on a curved portion of an adjacent set frame of the at least two set frames, wherein each of the pair of set frames is configured to rotate around the first axis, each of the at least one pair of links is configured to rotate around the second axis, and the support member is configured to move back and forth relative to the curved portions of each of the at least two set frames;
   a mid-layer disposed along an outer surface of the pair of set frames; and
   a flexible display panel along an outer surface of the mid-layer so that the flexible display panel is on an outer surface of the foldable display apparatus when the foldable display apparatus folds into a folded state, wherein the mid-layer comprises:
a support area corresponding to a gap between the pair of set frames when the foldable display apparatus is in the folded state,
a pair of folding areas connected to opposite sides of the support area and overlapping the curved portion of each of the pair of set frames when the foldable display apparatus is in the folded state, and
a pair of frame areas connected to each of the folding areas on a side opposite from the support area and overlapping a portion of each of the pair of set frames,
wherein the support member supports and withdraws support to the support area as the support member moves back and forth relative to the curved portions of the pair of set frames, and
wherein the support area remains flat in both the folded state and the unfolded state of the foldable display apparatus.

2. The foldable display apparatus of claim 1, wherein an upper corner edge on each side of the support member and a lower inner edge of each curved portion is shaped such that the support member and the curved portions of each of the pair of set frames no more than obliquely contact each other when the support member moves back and forth.

3. The foldable display apparatus of claim 1, wherein the support member includes a support end that protrudes towards the mid-layer.

4. The foldable display apparatus of claim 3, wherein the support end includes a concave recess.

5. A device, comprising:
a flexible display panel;
a mid-layer attached to the flexible display panel, wherein the mid layer includes a hinge region including a folding area, a support area, and a flat region;
at least a pair of set frames on which the mid-frame is attached; and
a compensation area disposed between each set frame, each compensation area expanding and contracting a space between each set frame as the device transitions between a folded state and an unfolded state,
wherein the folding area has slits that are spaced apart from each other,
wherein the support area remains flat in both the folded state and the unfolded state of the display apparatus,
wherein each compensation area includes at least one support member connected by links disposed on opposite sides of the at least one support member to an end portion of each set frame the at least one support member is disposed between,
wherein the at least one support member includes a support end that protrudes toward a portion of the mid-layer, and
wherein the support end contacts the support area in the unfolded state.

6. The device of claim 5, wherein an end portion of each set frame that overlaps the folding area when the foldable device is in the folded state is a curved portion.

7. The device of claim 5, wherein an upper corner edge on each side of the at least one support member and a lower inner edge of each curved portion is shaped such that the at least one support member and the curved portions of each of the pair of set frames no more than obliquely contact each other when the at least one support member moves back and forth.

8. The device of claim 5, wherein the folding area is disposed on portions of the mid-layer overlapping a compensation area when the foldable device is in the unfolded state.

9. The device of claim 8, wherein the support area is disposed on any portions of the folding area overlapping the at least one support member when the foldable device is in the unfolded state.

10. The device of claim 5, wherein the support end includes a concave recess.

11. A folding apparatus, comprising:
a pair of set frames facing each other when the folding apparatus is in an unfolded state;
a pair of joints, of which one joint includes a second portion connected to one in the pair of set frames and the other joint includes a second portion connected to the other in the pair of set frames;
a support member, wherein a first portion of each of the joints is connected to opposite sides of the support member; and
a flexible layer on the folding apparatus, such that it folds and unfolds along with the folding apparatus,
wherein a distance between the set frames is greater when the folding apparatus is in the unfolded state than when the folding apparatus is in a folded state, and the support member moves with a rotation of the pair of joints to compensate for a change in the distance between the pair of set frames,
wherein the flexible layer is on an outer surface of the folding apparatus when the folding apparatus is in the folded state,
wherein the flexible layer includes:
a support area corresponding to a gap between the pair of set frames when the folding apparatus is in the folded state; and
a pair of folding areas connected to opposite sides of the support area and overlapping a curved portion of each of the pair of set frames when the folding apparatus is in the folded state,
wherein the support area remains flat in both the folded state and the unfolded state of the folding apparatus,
wherein the support member includes a support end extending towards the flexible layer and provides support to an overlapping portion of the flexible layer when the folding apparatus is in the unfolded state, and
wherein the support end contacts the support area in the unfolded state.

12. The folding apparatus of claim 11, wherein a pair of end portions of a set frame of the pair of set frames are curved via the curved portion such that the flexible layer overlaid on the end portions is rounded when the folding apparatus is in the folded state.

13. The folding apparatus of claim 11, wherein the support member provides and removes support to the flexible layer as the support member moves back and forth.

14. The folding apparatus of claim 11, wherein the support end includes a concave recess.

15. The foldable display apparatus of claim 1, wherein the curved portions of the at least two set frames are further apart when in an unfolded state of the foldable display apparatus than when in the folded state of the foldable display apparatus.

16. The device of claim 5, wherein the support end extends parallel to each set frame in the folded state.

17. The folding apparatus of claim 11, wherein the support end extends parallel to the pair of set frames in the folded state.

\* \* \* \* \*